United States Patent
Sakaguchi et al.

(10) Patent No.: US 6,366,016 B1
(45) Date of Patent: Apr. 2, 2002

(54) MULTICOLOR ORGANIC ELECTROLUMINESCENT PANEL AND PROCESS FOR PRODUCTION THEREOF

(75) Inventors: Yoshikazu Sakaguchi; Jyoji Suzuki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/234,878

(22) Filed: Jan. 21, 1999

(30) Foreign Application Priority Data

Jan. 22, 1998 (JP) .......................................... 10-010566

(51) Int. Cl.⁷ ............................................. H05B 33/14
(52) U.S. Cl. ....................... 313/506; 313/504; 313/502; 428/917
(58) Field of Search ................................ 313/502, 504, 313/506, 112; 428/690, 917; 315/169.3

(56) References Cited

U.S. PATENT DOCUMENTS

| 5,688,551 A | * 11/1997 | Littman et al. | 313/502 |
| 5,895,692 A | * 4/1999 | Shirasaki et al. | 313/504 |
| 6,117,529 A | * 9/2000 | Leising et al. | 313/504 |

FOREIGN PATENT DOCUMENTS

| JP | 3-187192 | 8/1991 |
| JP | 3-233891 | 10/1991 |
| JP | 3-250583 | 11/1991 |
| JP | 5-258859 | 10/1993 |
| JP | 7-235378 | 9/1995 |
| JP | 8-213172 | 8/1996 |
| JP | 8-279394 | 10/1996 |
| JP | 9-082472 | 3/1997 |
| JP | 9-167684 | 6/1997 |
| JP | 10-326675 | 12/1998 |
| JP | 11-67454 | 3/1999 |
| JP | 11-191489 | 7/1999 |
| JP | 2000-509185 | 7/2000 |

* cited by examiner

*Primary Examiner*—Ashok Patel
(74) *Attorney, Agent, or Firm*—Young & Thompson (57) ABSTRACT

In a multicolor organic electroluminescent panel of the present invention, the organic luminescent layers are separated from each other between each adjacent pixels of different colors and the electron transport layer(s) has no gap between each adjacent pixels and is filled in each gap present between the organic luminescent layers. This organic electroluminescent panel can prevent the concentration or non-uniformity of the electric field so that short-circuiting or current leakage does not take place.

20 Claims, 8 Drawing Sheets

MULTICOLOR ORGANIC ELECTROLUMINESCENT PANEL AND PROCESS FOR PRODUCTION THEREOF

BACKGROUND OF THE INVENTION (i) Field of the Invention

The present invention relates to an organic electroluminescent panel, particularly a multicolor organic electroluminescent panel capable of emitting lights of three different wavelengths corresponding to red, green and blue colors, as well as to a process for producing the electroluminescent panel.

(ii) Description of the Prior Art

As a conventional process for producing a color organic electroluminescent panel of independent light-emission for red, green and blue colors, capable of emitting lights of different wavelengths corresponding to said three colors, there is disclosed, in JP-A-5-258859 (U.S. Pat. No. 5,294,869), a process which comprises forming a transparent electrode pattern made of ITO or the like, on a glass substrate, then placing a shadow mask made of an insulating material, on the substrate, and forming individual organic layers by utilizing the shadow mask.

Figure 6:
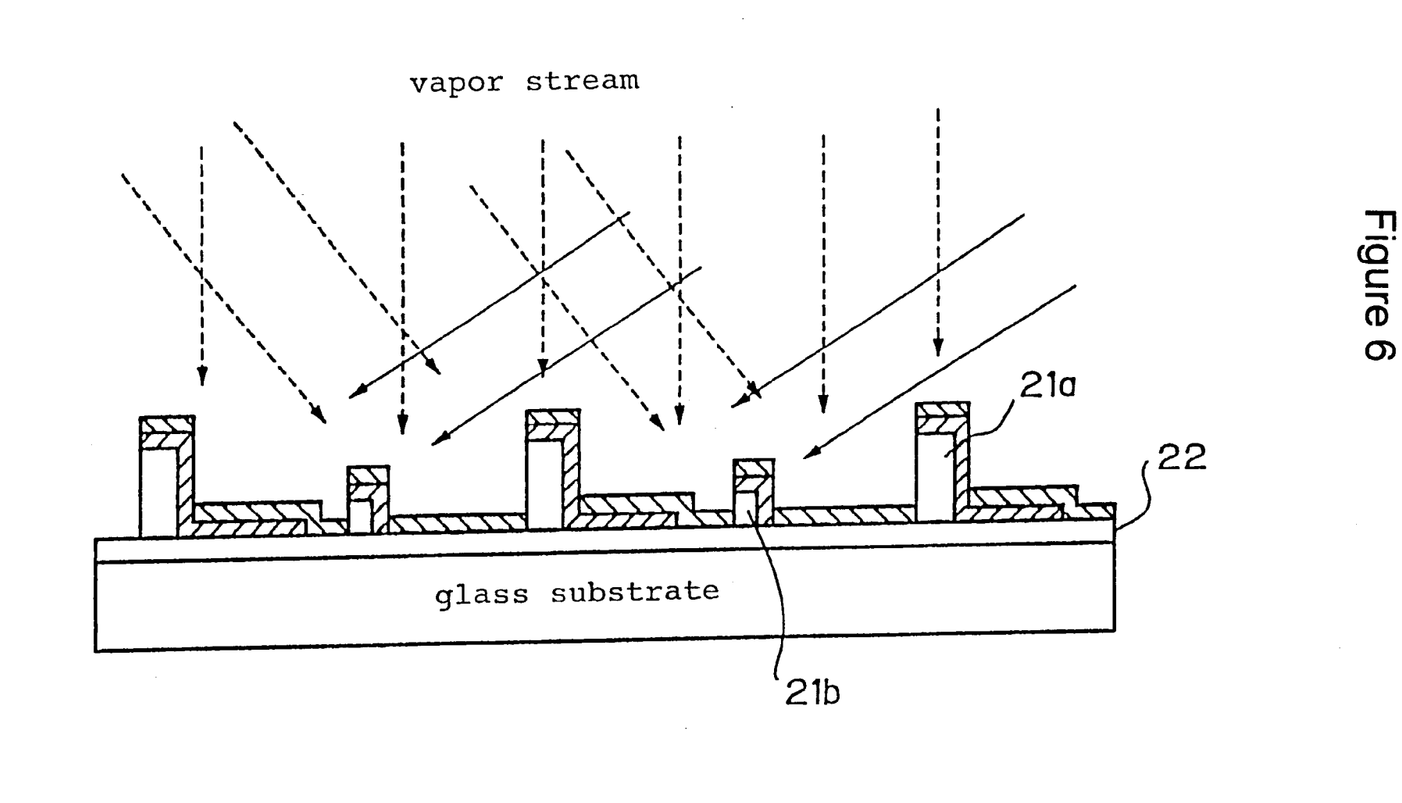
FIG. 6 is a drawing showing a process for producing a conventional multicolor organic electroluminescent panel.

According to this process, oblique vapor deposition is used for separation of three colors; that is, as shown in FIG. 6, in forming organic layers corresponding to three different colors, by vapor deposition, walls 21a and 21b of different heights are used to control the angle between the substrate and the vapor flow from vapor source and thereby a pattern of organic layers is formed. Lastly, an electrode metal is vapor-deposited in a direction normal to the ITO film 22 to form a cathode, whereby an organic electroluminescent panel is produced. In this process, however, the relative positioning of the vapor source, the substrate and the walls is very difficult; the thickness of each organic layer tends to become nonuniform; and the color separation between red, green and blue organic layers becomes insufficient. Further, the spaces emitting no light become large. Furthermore, when a large panel is produced, the geometric angle formed by the vapor source and the substrate differs between the center and the end both of the panel, making nonuniform the sizes of dots.

Figure 7:
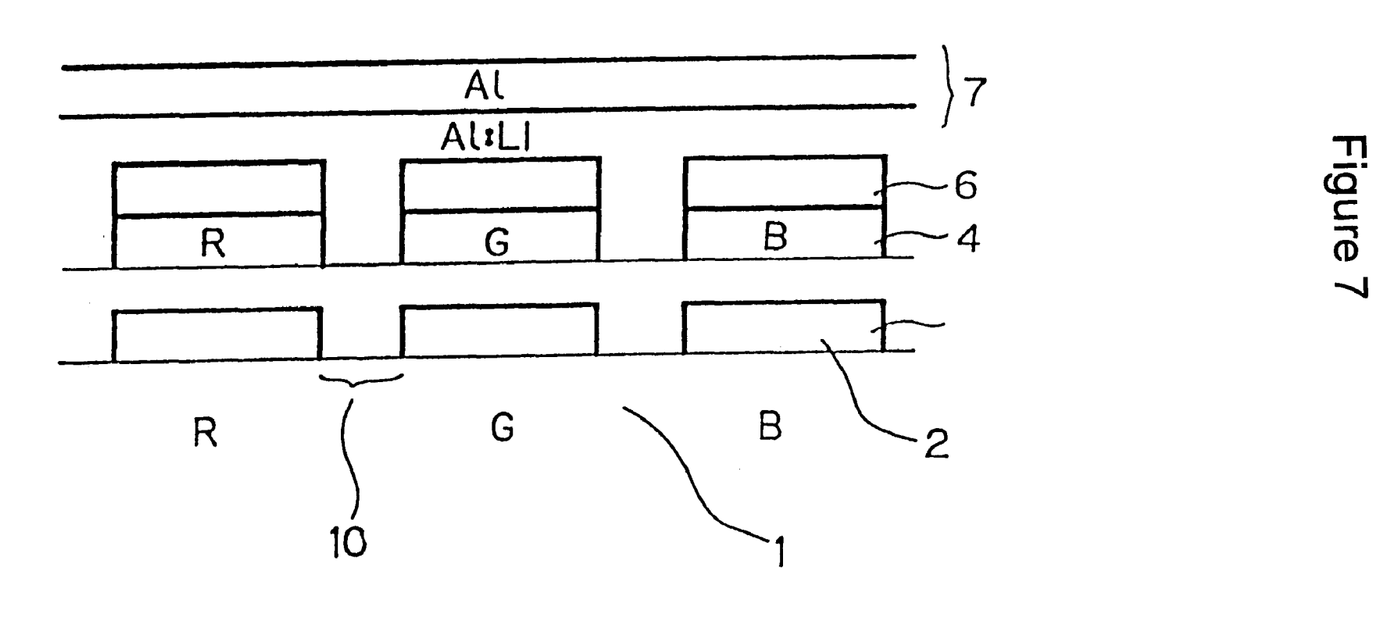
FIG. 7 is a drawing showing the constitution of a conventional multicolor organic electroluminescent panel.

In conventional ordinary panel structures, when red, green and blue organic luminescent layers are formed by vapor deposition, each organic luminescent layer and each electron transport layer was formed in the size only slightly larger than each luminescent portion in each pixel; therefore, there was an organic luminescent layer-free gap between each adjacent pixels of different colors, that is, in each space 10. When a cathode material is vapor-deposited on the electron transport layers, a cathode is formed also in the organic luminescent layer-free gap of said space as shown in FIG. 7; as a result, the cathode-anode distance becomes short at each space 10, resulting in appearance of electric field concentration or electric field nonuniformity in the space 10. Therefore, when the panel was produced in a dot matrix structure, there was a problem of random appearance of current leakage or short-circuiting in a pixel. Further, electric field concentration gave rise to nonuniform generation of Joule heat during operation, which incurred, in some cases, nonuniform deterioration of luminance and generation of dark spots in the panel.

In JP-A-9-167684 is described a process for forming organic electroluminescent layers mainly by a transfer printing method. In this process, however, it is impossible to form organic electroluminescent layers without making gaps between them, unless special consideration is made.

In JP-A-7-235378 is described a process which comprises forming a layer which becomes an electron-hole recombination region, then coating a fluorescent dye, thereafter applying a heat to diffuse the dye into the recombination region layer, and forming an electron transport layer. In this process, however, since a wet method is used for the formation of the recombination region layer, the efficiency of carrier injection and the efficiency of light emission are strikingly low; and it is difficult to make uniform diffusion and concentration distribution of the fluorescent dye and accordingly it is difficult to obtain uniform luminance and pixel pitch.

SUMMARY OF THE INVENTION

The present invention has been completed in order to solve the above-mentioned problems of the prior art. The present invention is intended to provide a multicolor organic electroluminescent panel which can prevent appearance of electric field concentration and electric field nonuniformity and which gives rise to neither short-circuiting nor current leakage therein and incurs neither nonuniform deterioration of luminance nor generation of dark spots therein, and a process for producing the electroluminescent panel.

The present invention is directed to a multicolor organic electroluminescent panel having, between two kinds of electrodes facing each other wherein at least one kind is transparent or translucent, organic luminescent layers each capable of emitting a light of different wavelength corresponding to predetermined colors and an electron transport layer(s), wherein:

the organic luminescent layers are separated from each other between each adjacent pixels of different colors and the electron transport layer(s) has no gap between each adjacent pixels and is filled in each gap present between the organic luminescent layers.

The present invention is also directed to a multicolor organic electroluminescent panel having, between two kinds of electrodes facing each other wherein at least one kind is transparent or translucent, organic luminescent layers each capable of emitting a light of different wavelength corresponding to predetermined colors and electron transport layer(s), wherein:

at least either of the organic luminescent layers and the electron transport layers overlap with each other at the boundary of each adjacent pixels of different colors.

The present invention is also directed to a process for producing a multicolor organic electroluminescent panel which comprises a step of forming, on a transparent substrate, organic luminescent layers each capable of emitting a light of different wavelength corresponding to predetermined colors and a step of forming an electron transport layer(s) on the organic luminescent layers, wherein:

the organic luminescent layers are formed so as to be separated from each other between each adjacent pixels of different colors and the electron transport layer(s) is formed so as to have no gap between each adjacent pixels and be filled in each gap present between the organic luminescent layers.

The present invention is further directed to a process for producing a multicolor organic electroluminescent panel which comprises a step of forming, on a transparent substrate, organic luminescent layers each capable of emitting a light of different wavelength corresponding to predetermined colors and a step of forming an electron transport layer(s) on the organic luminescent layers, wherein:

at least either of the organic luminescent layers and the electron transport layers are formed so as to overlap with each other at the boundary of each adjacent pixels of different colors.

The present invention is yet further directed to a process for producing a multicolor organic electroluminescent panel which comprises a step of forming, on a transparent substrate, organic luminescent layers each capable of emitting a light of different wavelength corresponding to predetermined colors and a step of forming an electron transport layer(s) on the organic luminescent layers, wherein:

at least either of the organic luminescent layers and the electron transport layers are formed for each of the colors by vapor deposition through a mask having openings larger than the luminescent portions of pixels so that they contact or overlap with each other between each adjacent pixels of different colors.

The present invention yet further directed to a process for producing a multicolor organic electroluminescent panel which comprises a step of forming, on a transparent substrate, organic luminescent layers each capable of emitting a light of different wavelength corresponding to predetermined colors and a step of forming an electron transport layer(s) on the organic luminescent layers, wherein:

both the organic luminescent layers and the electron transport layers are formed for each of the colors by vapor deposition of organic luminescent layer and electron transport layer in succession through a mask having openings larger than the luminescent portions of pixels so that both the organic luminescent layers and the electron transport layers contact or overlap with each other between each adjacent pixels of different colors.

In these figures, 1 is a glass substrate; 2 is an ITO electrode; 3 is a hole injection and transport layer; 4 is an organic luminescent layer; 4a is an organic luminescent layer (containing a dopant); 4b is an organic luminescent layer 7; (containing no dopant); 6 is an electron transport layer; 7 is a cathode; 13 is an α-NPD layer; 14R is a red organic luminescent layer; 14G is a green organic luminescent layer; 14B is a blue organic luminescent layer; 16 is a tris(8-hydroxyquinoline)aluminum ($Alq_3$) layer; 16R is a tris(8-hydroxyquinoline)aluminum ($Alq_3$) layer corresponding to a red color; 16G is a tris(8-hydroxyquinoline) aluminum ($Alq_3$) layer corresponding to a green color; and 16B is a tris(8-hydroxyquinoline)aluminum ($Alq_3$) layer corresponding to a blue color.

DETAILED DESCRIPTION OF THE INVENTION

In the multicolor organic electroluminescent panel of the present invention, since at least either of the organic luminescent layers and the electron transport layers are formed so as to have no gap between each adjacent pixels, there is no penetration of the cathode material into the gaps between adjacent pixels. As a result, there is no extreme proximity between cathode and anode and neither electric field concentration nor electric field nonuniformity appears. Therefore, in the multicolor organic electroluminescent panel of the present invention, short-circuiting and current leakage taking place owing to the extreme proximity between anode and cathode can be improved and the yield of panel production can be increased. Further, since electric field concentration hardly takes place, there is no nonuniform generation of joule heat during panel operation and it is possible to prevent nonuniform deterioration of luminance and generation of dark spots in panel.

Figure 1:
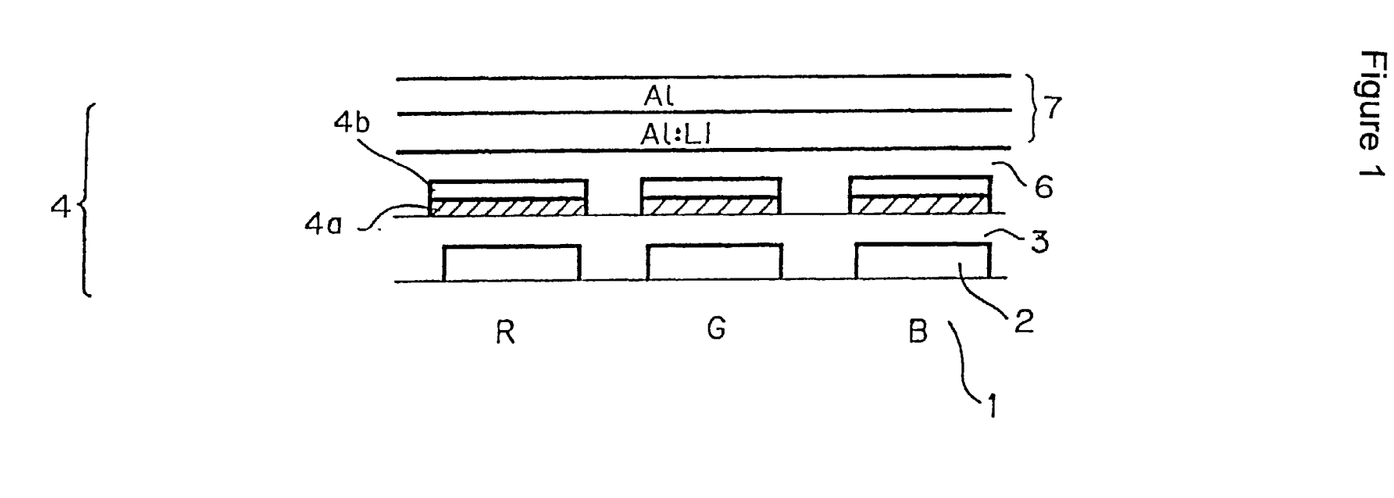
FIG. 1 is a drawing showing one embodiment of the multicolor organic electroluminescent panel of the present invention.

One embodiment of the present invention is shown in FIG. 1. In this embodiment, each ITO anode electrode 2 is formed on a glass substrate 1 so as to correspond to each pixel; thereon is formed a hole injection and transport layer 3; further thereon is formed each organic luminescent layer 4 (in FIG. 1, shown as 4a containing a dopant and 4b containing no dopant) so that the organic luminescent layers are separated between each adjacent pixels of different colors; thereon is formed an electron transport layer 6 so as to give no gap between each adjacent pixels and fill the gaps present between adjacent organic luminescent layers. The electron transport layer is formed as a continuous uniform film.

Known materials can be used for the organic luminescent layers. Preferably, a host material is used by being doped with a dopant. As the host material, there can be used, for example, 8-hydroxyquinoline metal complexes such as tris (8-hydroxyquinoline)aluminum and the like; distyrylbenzene derivatives such as 1,4-bis(2-methylstyryl)benzene and the like; bisstyrylanthracene derivatives; coumarin derivatives; and perylene derivatives. As the dopant, there can be used, for example, dicyanomethylenepyran dyes (R) such as 4-dicyanomethylene-2-methyl-6-(p-dimethylaminostyryl)-4H-pyran (abbreviated as DCM), 4-dicyanomethylene-2-methyl-6-[2-(9-julolidyl)ethenyl]-4H-thiopyran and the like; phenoxazine derivatives (R); squarylium dye (R); quinacridone derivatives (G) such as quinacridone, 2,9-dimethylquinacridone and the like; coumarin derivatives (G) such as 3-(2-benzothiazolyl)-7-diethylaminocoumarin (coumarin 540) and the like; perylene (B); dibenzonaphthacene (B); and benzopyrene (B). Incidentally, R, G and B in parentheses indicate the colors of emission by the individual cases.

Also, known materials can be used for the electron transport layer. There can be preferably used, for example, 8-hydroxyquinoline metal complexes such as tris(8-hydroxyquinoline)aluminum, bis(8-hydroxyquinoline) magnesium and the like; oxadiazole derivatives; and perylene derivatives.

In the present invention, it is preferred to have a hole injection and transport layer as shown in FIG. 1. However, the layer may be deleted as long as the organic luminescent layers have a capability of hole transport. It is possible to form the hole injection and transport layer in two layers consisting of a hole injection layer and a hole transport layer each made of a material having a high capability as either layer.

Known materials can be used for the hole injection and transport layer. There can be preferably used, for example, diamine derivatives such as N,N'-diphenyl-N,N'-di(3-methylphenyl)-1,1'-biphenyl-4,4'-diamine (abbreviated as TPD), N,N'-diphenyl-N,N'-bis((α-naphthyl)-1,1'-biphenyl-4,4'-diamine (abbreviated as α-NPD) and the like; and 4,4',4"-tris (3-methylphenylphenylamino) triphenylamine. When two layers consisting of a hole injection layer and a hole transport layer are formed, materials having a high capability as a respective layer can be selected from the above-mentioned materials.

Figure 4:
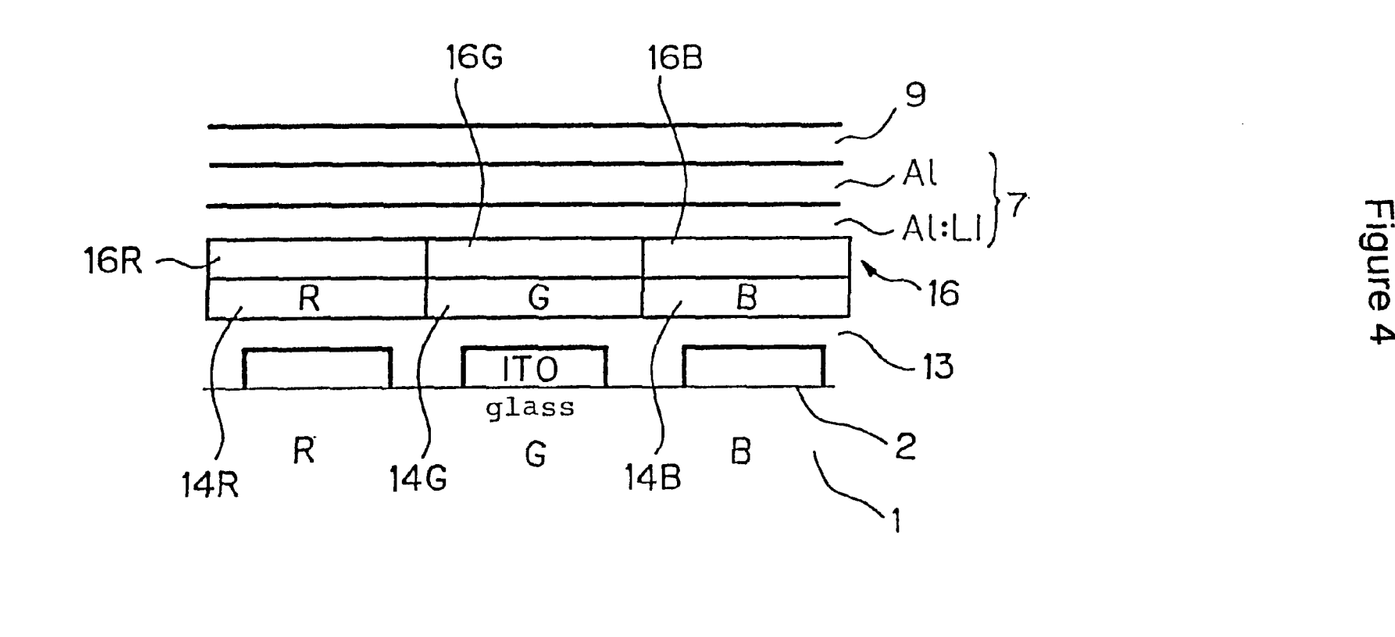
FIG. 4 is a drawing showing the constitution of the multicolor organic electroluminescent panel produced in Example 2.

In other embodiment of the present invention, at least either of the organic luminescent layers and the electron transport layers are formed so as to contact with each other between each adjacent pixels, as shown in FIG. 4. It is possible that both the organic luminescent layers and the electron transport layers are formed so as to contact with each other between each adjacent pixels, as shown in FIG. 4.

It is also possible that at least either of the organic luminescent layers and the electron transport layers are formed so as to overlap with each other at the boundary of each adjacent pixels. In this case, it is preferred that no overlapping takes place on each luminescent portion in each pixel.

Figure 8A:
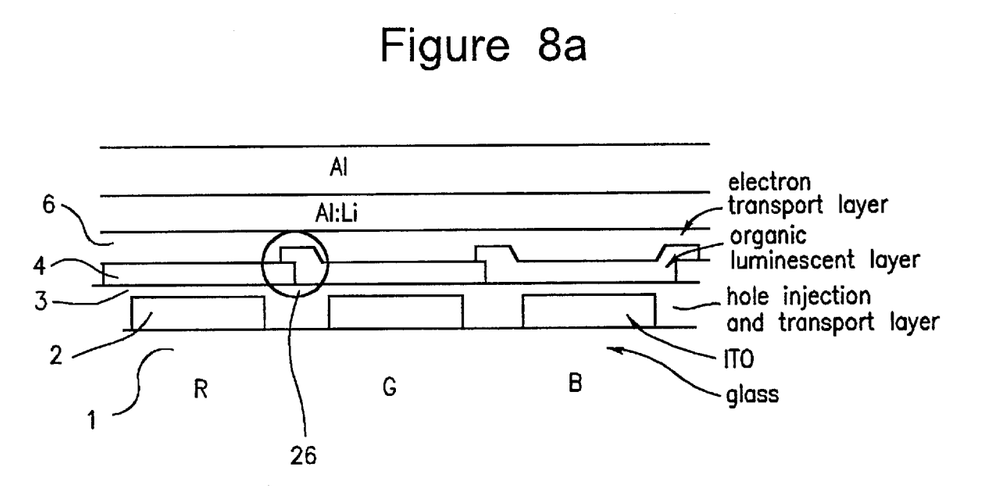
FIGS. 8a–b illustrate embodiments of the overlapping pixels of the organic luminescent layers and the overlapping sections of the electron transport layer.
Figure 8B:
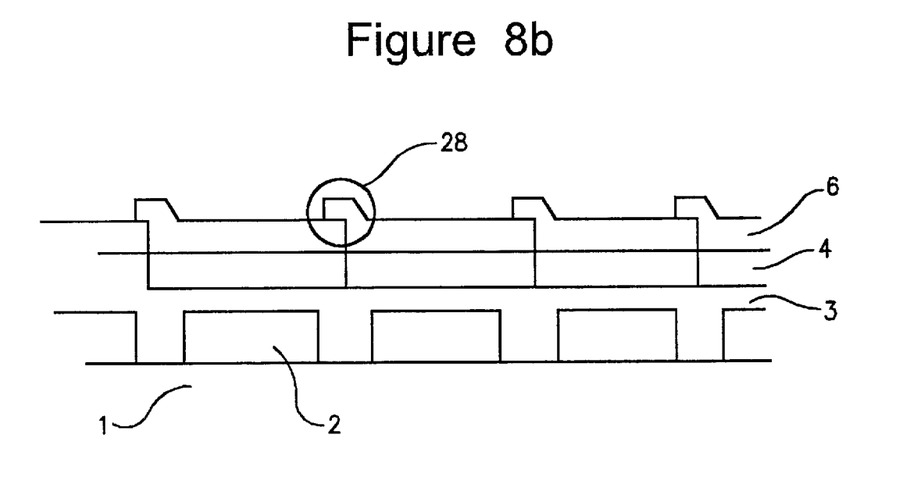

FIG. 8a illustrates overlapping edges of pixels of the organic luminescent layer at 26. FIG. 8b illustrates overlapping edges of sections of the electron transport layer at 28.

EXAMPLES

The present invention is described in more detail below by way of Examples.

EXAMPLE 1

This Example is described with reference to FIGS. 2 and 3. First, as shown in FIG. 3, an ITO film 2 was formed on a 1.1 mm-thick glass substrate 1 (as a transparent substrate) in a thickness of 120 nm by sputtering, and the film was subjected to lithography and wet etching to form anode electrodes. The anode electrodes were each formed in a stripe shape having a sheet resistance of 15 Ω/□ and an anode pitch of 40 $\mu$m.

On the glass substrate having anode electrodes formed thereon, a hole injection and transport layer, i.e. a layer 13 of α-NPD (N,N'-diphenyl-N,N'-bis(α-naphthyl)-1,1'-biphenyl-4,4'-diamine) was formed by vacuum deposition as a non-patterned layer in a thickness of 50 nm.

Figure 2:
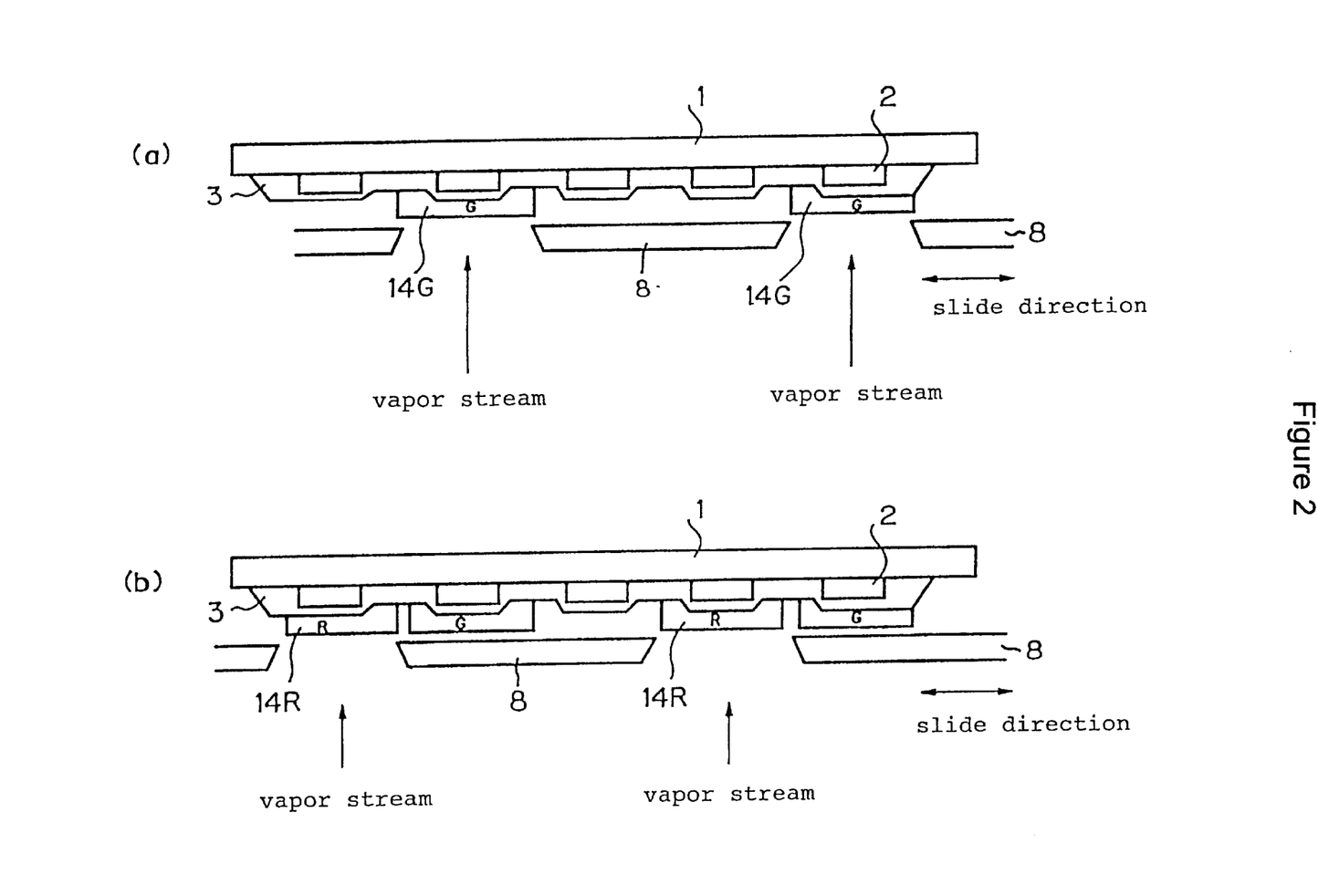
FIG. 2 is a drawing showing the present process for producing a multicolor organic electroluminescent panel, used in Example 1.
Figure 3:
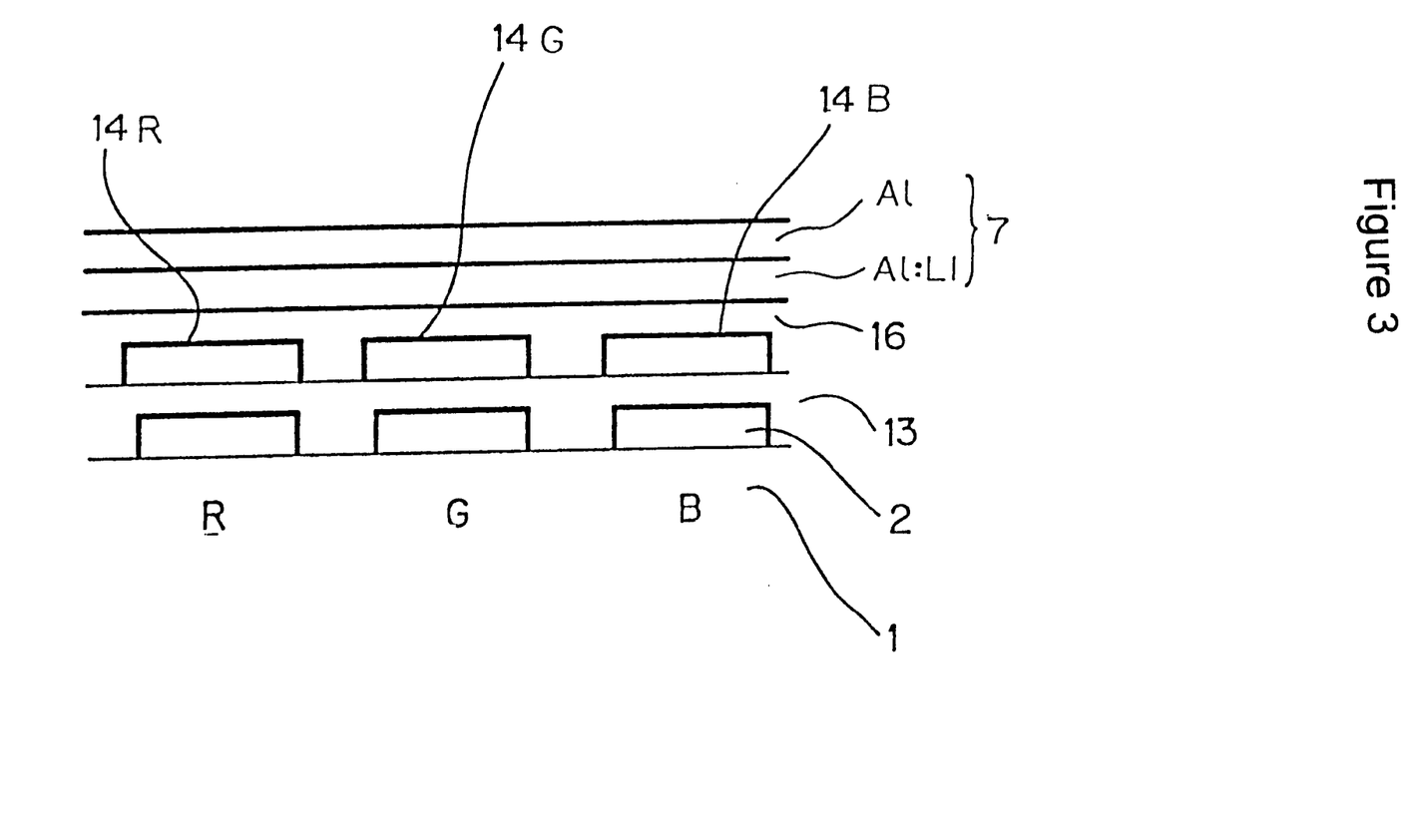
FIG. 3 is a drawing showing the constitution of the multicolor organic electroluminescent panel produced in Example 1.

As shown in FIG. 2(a), thereon was set, in a near contact (50 $\mu$m or less) with the substrate, a metal mask 8 having a stripe-shaped window pattern (each window width; 80 to 90 $\mu$m corresponding to one dot, each mask portion width: 280 $\mu$m corresponding to two dots and one space) which corresponds to pixels for each color (red, green and blue). Then a tris(8-hydroxyquinoline)aluminum (hereinafter referred to as Alq$_3$) as a host material and quinacridone (doping concentration: 10% by weight) as a dopant were vapor-deposited simultaneously through the metal mask 8 in a thickness of 25 nm to form an organic luminescent layer of green pixel, i.e. a green organic luminescent layer 14G.

Subsequently, as shown in FIG. 2(b), the metal mask 8 was moved to a position corresponding to red pixel, and a tris(8-hydroxyquinoline)aluminum (host) and 4-dicyanomethylene-2-methyl-6-(p-dimethylaminostyryl)-4H-pyran (DCM) (dopant, doping concentration: 14% by weight) were vapor-deposited simultaneously through the mask 8 in a thickness of 25 nm to form an organic luminescent layer of red pixel, i.e. a red organic luminescent layer 14R.

Lastly, the metal mask 8 was moved to a position corresponding to blue pixel, and 1,4-distyrylbenzene was vapor-deposited in a thickness of 25 nm to form an organic luminescent layer of blue pixel, i.e. a blue organic luminescent layer 14B. Incidentally, it is possible to vapor-deposit a tris(8-hydroxyquinoline)aluminum (host) and perylene (dopant, doping concentration: 2% by weight) simultaneously in a thickness of 25 nm to form an organic luminescent layer of blue pixel.

After red, green and blue organic luminescent layers were thus formed, a tris(8-hydroxyquinoline)aluminum (Alq$_3$) layer 16 was formed as an electron transport layer in a thickness of 30 nm by vapor deposition, as shown in FIG. 3. In this case, the gaps between the organic luminescent layers 14R, 14G and 14B are filled with the Alq$_3$ layer 16.

Next, Al and Li were vapor-deposited simultaneously in a thickness of 30 nm through a mask having windows of 240 $\mu$m in width so as to intersect at right angles to the ITO electrodes 2 and the organic luminescent layers 14R, 14G and 14B, all of stripe shape; thereafter, Al alone was vapor-deposited in a thickness of 170 nm; thereby, a cathode was formed.

In the above steps, the vapor deposition conditions for formation of organic luminescent layers are controlled so that the vacuum during vapor deposition becomes $1 \times 10^{-3}$ Pa or less, preferably $5 \times 10^{-4}$ Pa or less, the vapor deposition rate becomes 0.05 to 2 nm/sec, and the substrate temperature becomes 100° C. or less.

There was thus formed an organic electroluminescent panel capable of emitting red, green and blue lights independently, which had picture elements (RGB sets) of 320 dots (low)×240 dots (column), a dot width of 80 $\mu$m, a gap distance (dot space) of 40 $\mu$m, and a picture element (RGB set) pitch of 0.36 mm (low)×0.36 mm (column).

The above panel was operated at a duty ratio of 1/240. At the start, there were no defective pixels owing to short-circuiting or leakage; even after 120 hours of operation, there were no defective pixels.

In Example 1, it is possible to use an optimum material for each host of the red, green and blue organic luminescent layers.

EXAMPLE 2

This Example is described with reference to FIG. 4. First, an ITO film was formed on a 1.1 mm-thick glass substrate in a thickness of 120 nm and the film was subjected to lithography and wet etching to form transparent anode electrodes, in the same manner as in Example 1. The anode electrodes had a sheet resistance of 15 Ω/□ and an anode pitch of 40 $\mu$m.

On the glass substrate having anode electrodes formed thereon, a hole injection and transport layer, i.e. an α-NPD layer 13 was formed as a non-patterned layer by vacuum deposition in a thickness of 40 nm.

Figure 5:
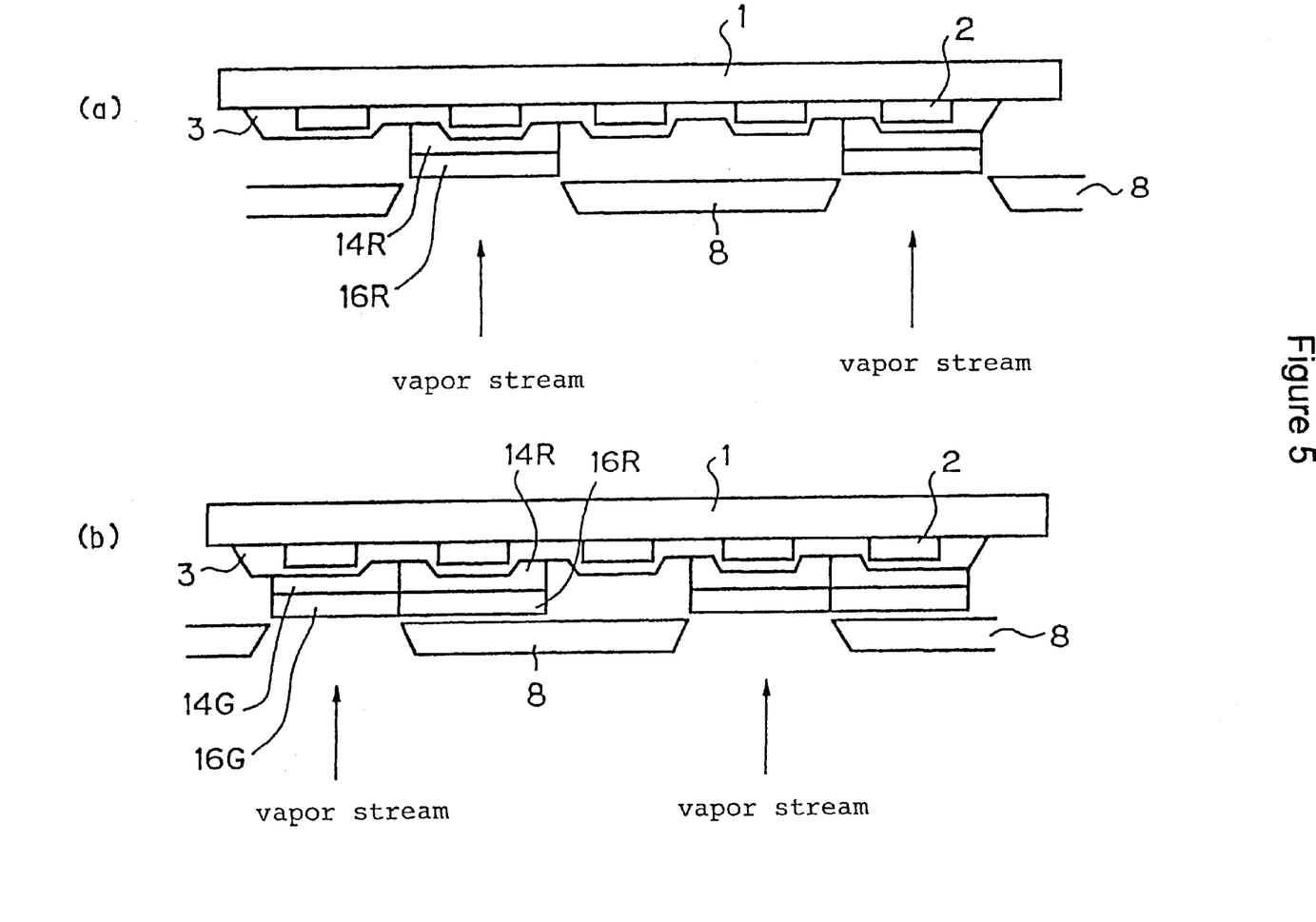
FIG. 5 is a drawing showing the present process for producing a multicolor organic electroluminescent panel, used in Example 2.

As shown in FIG. 5(a), thereon was set, in a near contact (50 $\mu$m or less) with the substrate, a metal mask 8 having a stripe-shaped window pattern (each window width; 120 $\mu$m corresponding to one dot and one gap, each mask portion width: 220 μm corresponding to two dots and one gap) which corresponds to pixels of each color. Then a tris (8-hydroxyquinoline)aluminum (host) and DCM (dopant, doping concentration: 15% by weight) were vapor-deposited simultaneously through the metal mask 8 in a thickness of 25 nm to form a red organic luminescent layer 14R. Subsequently, a tris (8-hydroxyquinoline)aluminum was vapor-deposited through the same mask 8 at the same position in a thickness of 30 nm to form an electron transport layer 16R.

Subsequently, as shown in FIG. 5(*b*), the metal mask 8 was moved to a position corresponding to green pixel, and a tris (8-hydroxyquinoline)aluminum (host) and quinacridone (dopant, doping concentration: 10% by weight) were vapor-deposited simultaneously through the metal mask 8 in a thickness of 25 nm to form a green organic luminescent layer 14G. Subsequently, a tris (8-hydroxyquinoline) aluminum was vapor-deposited through the mask 8 in a thickness of 30 nm to form an electron transport layer 16G.

Lastly, the metal mask 8 was moved to a position corresponding to blue pixel, and 4,4'-bis(2,2-diphenylvinyl) biphenyl was vapor-deposited through the metal mask 8 in a thickness of 25 nm to form a blue organic luminescent layer 14B. Subsequently, a tris(8-hydroxyquinoline) aluminum was vapor-deposited through the metal mask 8 in a thickness of 30 nm to form an electron transport layer 16B.

After the red, green and blue organic luminescent layers and the electron transport layers were thus formed so as to contact with each other between respective adjacent layers, Al and Li were vapor-deposited simultaneously in a thickness of 30 nm and then only Al was vapor-deposited in a thickness of 150 nm to form a cathode 7.

Further, $SiO_2$ was vacuum-deposited in a thickness of 20 nm (ordinarily 10 to 100 nm) so as to cover the organic thin films and the total cathode, whereby a protective film 9 was formed.

In the above steps, the vapor deposition conditions for formation of the organic layers are controlled so that the vacuum during vapor deposition becomes $1\times10^{-3}$ Pa or less, preferably $5\times10^{-4}$ Pa or less, the vapor deposition rate becomes 0.05 to 2 nm/sec, and the substrate temperature becomes 100° C. or less (these conditions are the same as in Example 1).

In vapor-deposition of $SiO_2$, resistance heating was used, the vacuum before vapor deposition was $4\times10^{-4}$ Pa, the vapor-deposition rate was 0.3 nm/sec, and the substrate temperature was 60° C. or less. Electron beam heating may be used in the vapor-deposition.

There was thus formed an organic electroluminescent panel having picture elements (RGB sets) of 320 dots (low)×240 dots (column), a dot width of 80 μm, a gap distance of 40 μm, and a picture element (RGB set) pitch of 0.36 mm (low)×0.36 mm (column).

The above panel was operated at a duty ratio of 1/240. At the start, there were no defective pixels owing to short-circuiting or leakage; even after 150 hours of operation, there were no defective pixels.

In this Example, there was described a case wherein both the organic luminescent layers and the electron transport layers contact with each other between each adjacent pixels. Both the organic luminescent layers and the electron transport layers may be allowed to overlap with each other by widening the openings of the mask used, as long as the allowable luminescent area is secured.

In Example 2, an optimum material for the host of organic luminescent layer and an optimum material for electron transport layer may be selected for each color.

As the material for cathode, there may be used, besides those used in Examples 1 and 2, metals or alloys of small work function, such as magnesium, silver and the like. As the deposition method for the formation of cathode film, film formation technique such as resistance heating method, electron beam heating method or the like may be used by using these metals or alloys.

As described above, according to the present invention, red, green and blue pixels are filled with organic materials; as a result, there is no place where the distance between cathode (e.g. Li) and anode (ITO) is extremely small, and electric field nonuniformity and electric field concentration can be prevented.

Therefore, the problem of short-circuiting and current leakage is improved which tend to occur at the places where the distance between cathode and anode is extremely small, and the yield of panel production can be increased.

Further, since electric field concentration hardly takes place, there is no nonuniform generation of joule heat during panel operation and accordingly it is possible to prevent nonuniform deterioration of luminance and generation of dark spots in panel.

What is claimed is:

1. A multicolor organic electroluminescent panel comprising:
    a substrate;
    an anode having separated elements on a first side of said substrate;
    an organic luminescent layer on said first side of said substrate and having separated pixels that are over said separated elements of said anode, said separated pixels of said organic luminescent layer being arranged to emit light of different wavelengths;
    an electron transport layer on said organic luminescent layer and between said separated pixels of said organic luminescent layer; and
    a cathode on said electron transport layer.

2. The panel of claim 1, further comprising a hole injection and transport layer directly on said anode beneath said organic luminescent layer and directly on said glass substrate between said separated elements of said anode, and wherein said organic luminescent layer is directly on said hole injection and transport layer.

3. The panel of claim 2, wherein said hole injection and transport layer comprises a hole injection layer and a hole transport layer distinct from said hole injection layer.

4. The panel of claim 2, wherein said electron transport layer is a continuous film.

5. The panel of claim 2, wherein said organic luminescent layer comprises a doped layer on said hole injection and transport layer and an undoped layer on and distinct from said doped layer.

6. The panel of claim 1, wherein said electron transport layer is a continuous film.

7. The panel of claim 1, wherein said organic luminescent layer comprises a doped layer and an undoped layer on and distinct from said doped layer.

8. A multicolor organic electroluminescent panel comprising:
    a substrate;
    an anode having separated elements on a first side of said substrate;
    an organic luminescent layer on said first side of said substrate and having pixels that are over said separated elements of said anode, said pixels of said organic luminescent layer being arranged to emit light of different wavelengths, each of said pixels having an edge that overlaps an edge of an adjacent one of said pixels at a boundary between adjacent said pixels of different wavelengths;

an electron transport layer on said organic luminescent layer; and a cathode on said electron transport layer.

9. The panel of claim 8, wherein said electron transport layer comprises second elements that are over said separated elements of said anode, each of said second elements having an edge that overlaps an edge of an adjacent one of said second elements.

10. The panel of claim 8, further comprising a hole injection and transport layer directly on said anode beneath said organic luminescent layer and directly on said glass substrate between said separated elements of said anode, and wherein said organic luminescent layer is directly on said hole injection and transport layer.

11. The panel of claim 10, wherein said hole injection and transport layer comprises a hole injection layer and a hole transport layer distinct from said hole injection layer.

12. The panel of claim 8, wherein said organic luminescent layer comprises a doped layer on said hole injection and transport layer and an undoped layer on and distinct from said doped layer.

13. The panel of claim 8, wherein the overlapping edges do not extend over said separate elements of said anode.

14. The panel of claim 8, wherein said organic luminescent layer is stripe-shaped.

15. A multicolor organic electroluminescent panel comprising:

a substrate;

an anode having separated first elements on a first side of said substrate;

an organic luminescent layer on said first side of said substrate and having pixels that are over said separated first elements, said pixels of said organic luminescent layer being arranged to emit light of different wavelengths;

an electron transport layer on said organic luminescent layer, said electron transport layer comprising second elements that are over said separated first elements of said anode, each of said second elements having an edge that overlaps an edge of an adjacent one of said second elements at a boundary between adjacent ones of said pixels of different wavelengths; and a cathode on said electron transport layer.

16. The panel of claim 15, further comprising a hole injection and transport layer directly on said anode beneath said organic luminescent layer and directly on said glass substrate between said separated elements of said anode, and wherein said organic luminescent layer is directly on said hole injection and transport layer.

17. The panel of claim 16, wherein said hole injection and transport layer comprises a hole injection layer and a hole transport layer distinct from said hole injection layer.

18. The panel of claim 15, wherein said organic luminescent layer comprises a doped layer on said hole injection and transport layer and an undoped layer on and distinct from said doped layer.

19. The panel of claim 15, wherein the overlapping edges do not extend over said separated elements of said anode.

20. The panel of claim 15, wherein said electron transport layer is stripe-shaped.

* * * * *